United States Patent
Raj et al.

(10) Patent No.: US 11,900,996 B2
(45) Date of Patent: Feb. 13, 2024

(54) MEMORY STRUCTURE WITH SELF-ADJUSTING CAPACITIVE COUPLING-BASED READ AND WRITE ASSIST

(71) Applicant: GLOBALFOUNDRIES U.S. Inc., Malta, NY (US)

(72) Inventors: Vivek Raj, Bangalore (IN); Bhuvan R. Nandagopal, Vellore (IN); Shivraj G. Dharne, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 196 days.

(21) Appl. No.: 17/504,558

(22) Filed: Oct. 19, 2021

(65) Prior Publication Data

US 2023/0122564 A1  Apr. 20, 2023

(51) Int. Cl.
*G11C 11/419* (2006.01)
*G11C 11/418* (2006.01)
*G11C 11/412* (2006.01)

(52) U.S. Cl.
CPC .......... *G11C 11/419* (2013.01); *G11C 11/412* (2013.01); *G11C 11/418* (2013.01)

(58) Field of Classification Search
CPC ... G11C 11/415; G11C 11/416; G11C 11/413; G11C 11/412; G11C 11/418; G11C 11/419
USPC .......................................................... 365/154
See application file for complete search history.

(56) References Cited

U.S. PATENT DOCUMENTS

| | | | |
|---|---|---|---|
| 9,281,311 B2 | 3/2016 | Wu et al. | |
| 9,318,188 B2* | 4/2016 | Liaw | G11C 11/00 |
| 9,460,776 B2 | 10/2016 | Dally | |
| 2015/0162058 A1* | 6/2015 | Joshi | G11C 15/04 |
| | | | 365/189.11 |
| 2016/0343428 A1 | 11/2016 | Chan et al. | |

(Continued)

OTHER PUBLICATIONS

Chang et al., "A 5-nm 135-Mb SRAM in EUV and High-Mobility Channel FinFET Technology With Metal Coupling and Charge-Sharing Write-Assist Circuitry Schemes for High-Density and Low-VMIN Applications," IEEE Journal of Solid-State Circuits, vol. 56, No. 1, 2021, pp. 179-187.

(Continued)

*Primary Examiner* — Sung Il Cho
(74) *Attorney, Agent, or Firm* — David Cain; Hoffman Warnick LLC

(57) ABSTRACT

Disclosed is a memory structure that includes wordlines (WL) and cell supply lines (CSL) positioned between and parallel to voltage boost lines (VBLs). The VBLs enable capacitive coupling-based voltage boosting of the adjacent WL and/or CSL depending on whether a read or write assist is required. During a read operation, all VBLs for a selected row can be charged to create coupling capacitances with the WL and with the CSL and thereby boost both the wordline voltage (Vwl) and the cell supply voltage (Vcs) for a read assist. During a write operation, one VBL adjacent to the WL for a selected row can be charged to create a coupling capacitance with the WL only and thereby boost the Vwl for a write assist. The coupling capacitances created by charging VBLs in the structure is self-adjusting in that as the length of the rows increase so do the potential coupling capacitances.

20 Claims, 8 Drawing Sheets

(56) References Cited

U.S. PATENT DOCUMENTS

| | | | |
|---|---|---|---|
| 2018/0174959 A1* | 6/2018 | Kim | G11C 11/4097 |
| 2019/0180798 A1* | 6/2019 | Ahmed | G11C 7/12 |
| 2021/0249416 A1* | 8/2021 | Li | G11C 11/4074 |

OTHER PUBLICATIONS

Kulkarni et al., "Capacitive-Coupling Wordline Boosting with Self-Induced VCC Collapse for Write VMIN Reduction in 22-nm 8T SRAM," IEEE International Solid-State Circuits Conference, 2012, pp. 234-236.

Mu et al., "Edge Couplers in Silicon Photonic Integrated Circuits: A Review," MDPI, Appl. Sci., 10, 1538, 2020, pp. 1-29.

Zimmer et al., "SRAM Assist Techniques for Operation in a Wide Voltage Range in 28-nm CMOS," IEEE Transactions on Circuits and Systems-II, Express Briefs, vol. 59, No. 12, 2012, pp. 853-857.

Cho et al., "Accuracy-Aware SRAM: A Reconfigurable Low Power SRAM Architecture for Mobile Multimedia Applications," IEEE, 2009, pp. 823-828.

Qazi et al., "Challenges and Directions for Low-Voltage SRAM," IEEE Design & Test Computers, 2011, pp. 32-43.

\* cited by examiner

MEMORY STRUCTURE WITH SELF-ADJUSTING CAPACITIVE COUPLING-BASED READ AND WRITE ASSIST

BACKGROUND

Field of the Invention

The present invention relates to memory circuits and, more particularly, to embodiments of memory structure with capacitive coupling-based read and write assist.

Description of Related Art

Key factors considered in modern integrated circuit design include, but are not limited to, performance, power scaling, and size scaling. However, oftentimes improvement with respect to one of these factors can result in an undesirable trade-off with respect to one or more of the other factors. For example, in a single rail memory structure, such as a single rail static random access memory (SRAM) structure, a positive power supply (Vdd) can be used to power the entire memory structure. That is, the same Vdd can be used for powering the memory cells within a memory array, for charging wordlines connected to the memory cells within the array during read and write operations, etc. Reducing the Vdd level, results in a corresponding reduction in power consumption and leakage power. Unfortunately, reducing the Vdd level also negatively impacts performance and, more specifically, makes the memory structure more susceptible to both read fails and write fails.

SUMMARY

In view of the foregoing, disclosed herein are memory structure embodiments with self-adjusting capacitive coupling-based voltage boosting for read and write assists. In each embodiment, wordlines (WLs) and cell supply lines (CSLs) for rows of memory cells in an array are each positioned between and parallel to voltage boost lines (VBLs). These VBLs enable capacitive coupling-based voltage boosting of the adjacent WL and/or CSL depending on whether a read assist or a write assist is required. For example, during a read operation, all VBLs for a selected row can be charged to create coupling capacitances with the WL and with the CSL in order to boost both the wordline voltage (Vwl) and the cell supply voltage (Vcs) for a read assist. During a write operation, one VBL adjacent to the WL for a selected row can be charged to create a coupling capacitance with the WL only in order to boost the wordline voltage (Vwl) for a write assist. In some embodiments, each row can have a corresponding CSL and voltage boost circuit. In other embodiments, adjacent rows can share the same CSL and voltage boost circuit to minimize any size increase. In any case, the coupling capacitance created by charging a VBL adjacent to a WL or CSL is not fixed. Instead, it is self-adjusting. That is, as the number of memory cells in each row increases (i.e., as the number of columns increases) so do the lengths of the VBLs, the WL and the CSL and, thus, so do any coupling capacitances created by charging the VBLs.

Disclosed herein are various embodiments of a memory structure. Each embodiment can include, within the same back end of the line (BEOL) metal level, multiple parallel conductive lines. These parallel conductive lines can include a first voltage boost line (VBL), a wordline (WL), a second VBL, a cell supply line (CSL), and a third VBL. The WL and the CSL can both be connected to all memory cells in a row of memory cells within a memory array. The WL can be positioned between and parallel to the first VBL and the second VBL. The CSL can be positioned between and parallel to the second VBL and the third VBL. Each embodiment can further include a voltage boost circuit connected to the first VBL, the WL, the second VBL, and the third VBL.

In some embodiments, each row can have a corresponding CSL and voltage boost circuit. However, in other embodiments, the CSL and the voltage boost circuit can be shared between a pair of adjacent rows. For example, some embodiments of the memory structure can include, with in the same back end of the line (BEOL) metal level, multiple parallel conductive lines. These parallel conductive lines can include a first VBL, a first WL, a second VBL, a shared CSL, a third VBL, a second WL, and a fourth VBL. The first WL and the shared CSL can both be connected to all memory cells in a first row of memory cells within a memory array. The second WL and the shared CSL can both be connected to all memory cells in a second row of memory cells adjacent to the first row within the memory array. Additionally, the first WL can be positioned between and parallel to the first VBL and the second VBL. The cell supply line can be positioned between and parallel to the second VBL and the third VBL. The second WL can be positioned between and parallel to the third VBL and the fourth VBL. Each embodiment can further include a voltage boost circuit connected to the first VBL, the first WL, the second VBL, the third VBL, the second WL, and the fourth VBL.

In some embodiments, the voltage boost circuit can specifically be a digital voltage boost circuit. The configuration of the digital voltage boost circuit and, particularly, the logic gates included therein can vary, for example, depending upon whether or not the CSL and voltage boost circuit are shared between adjacent rows.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
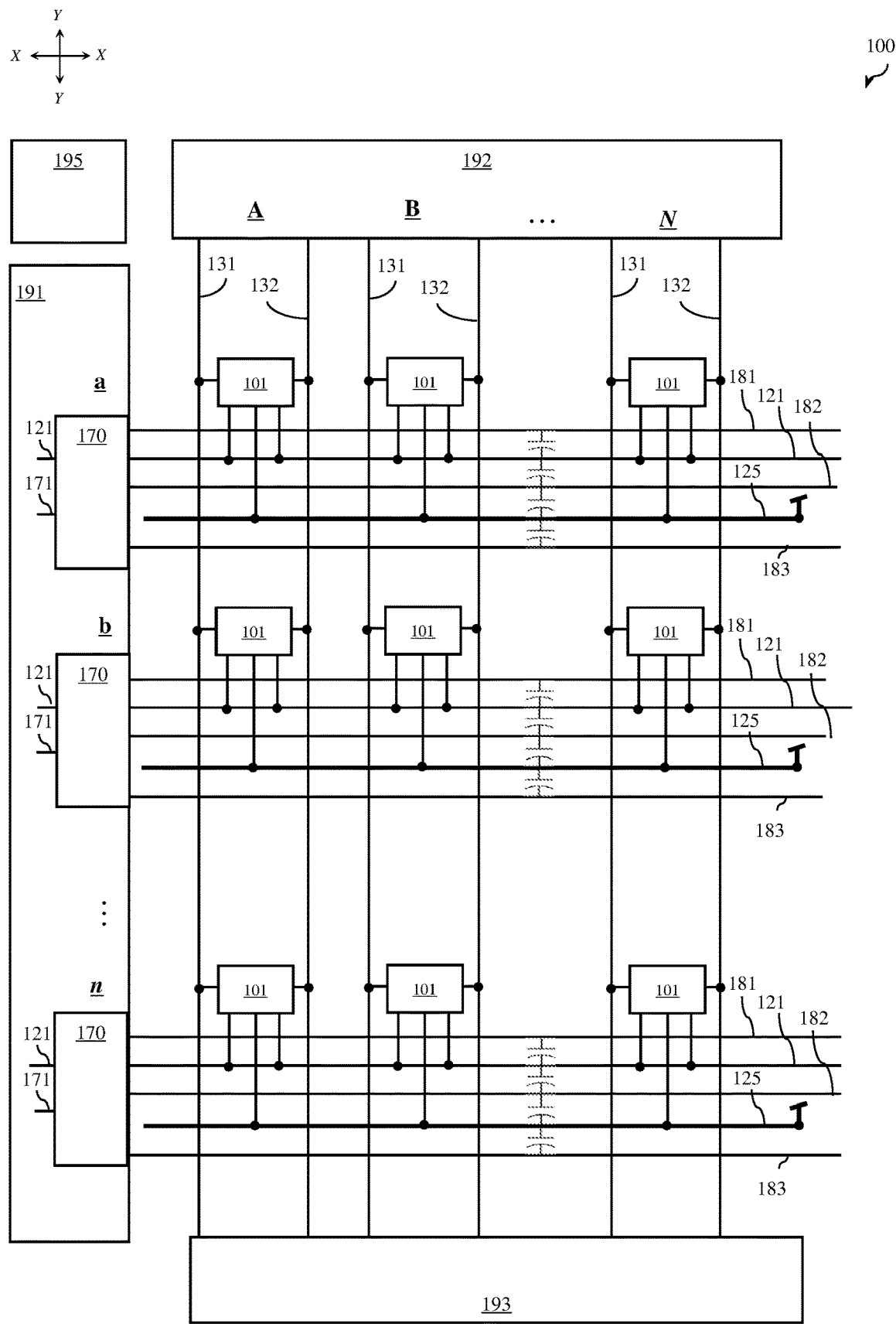
FIG. 1A is a schematic diagram illustrating an embodiment of a memory structure with self-adjusting capacitive coupling-based voltage boosting for read and write assists.

As mentioned above, key factors considered in modern integrated circuit design include, but are not limited to, performance, power scaling, and size scaling. However, oftentimes improvement with respect to one of these factors can result in an undesirable trade-off with respect to one or more of the other factors. For example, in a single rail memory structure, such as a single rail static random access memory (SRAM) structure, a positive power supply (Vdd) can be used to power the entire memory structure. That is, the same Vdd can be used for powering memory cells with a memory array, for charging wordlines connected to the memory cells during read and write operations, etc. Reducing Vdd level, results in a corresponding reduction in power consumption and leakage power. Unfortunately, reducing the Vdd level also negatively impacts performance and, more specifically, makes the memory structure more susceptible to both read fails and write fails.

Techniques for minimizing read fails and write fails when using a low or ultra-low Vdd to power a memory structure include voltage boosting on wordlines and/or cell supply lines depending upon the operation. For example, during a read operation and/or a write operation, the wordline voltage on the wordline connected to a selected memory cell can be charged to Vdd and then boosted from Vdd to Vdd+ in order to improve the speed of the operation. Additionally, or alternatively, during a read operation, the cell supply voltage on the cell supply line (CSL) can connected to the selected memory cell can be boosted from Vdd to Vdd+. These techniques typically employ boost devices (e.g., P-type field effect transistor-based devices), which are connected to each of the wordlines (WLs) and, if applicable, to each of the cell supply lines (CSLs) in an array and which are configured to provide a fixed amount of coupling capacitance to those lines in response to control signals. However, if too many memory cells are included in each of the rows (i.e., if there are too many columns in the array) so that the lines are relatively long, the fixed amount of coupling capacitance may be insufficient to achieve the desired voltage boost across the full length of the lines and, particularly, at the ends of the lines distal to the boost devices. One proposed solution is to use programmable voltage boost devices so that the amount of coupling capacitance can be set to one of a limited number of different fixed coupling capacitance settings based on the final number of columns included in the memory array. However, this solution is still a coarse-grained solution and it has the disadvantage of increasing the Tiler code complexity.

In view of the foregoing, disclosed herein are memory structure embodiments with self-adjusting capacitive coupling-based voltage boosting for read and write assists. In each embodiment, wordlines (WLs) and cell supply lines (CSLs) for rows of memory cells in an array are each positioned between and parallel to voltage boost lines (VBLs). These VBLs enable capacitive coupling-based voltage boosting of the adjacent WL and/or CSL depending on whether a read assist or a write assist is required. For example, during a read operation, all VBLs for a selected row can be charged to create coupling capacitances with the WL and with the CSL in order to boost both the wordline voltage (Vwl) and the cell supply voltage (Vcs) for a read assist. During a write operation, one VBL adjacent to the WL for a selected row can be charged to create a coupling capacitance with the WL only in order to boost Vwl for a write assist. In some embodiments, each row can have a corresponding CSL and voltage boost circuit. In other embodiments, adjacent rows can share the same CSL and voltage boost circuit to minimize any size increase. In any case, the coupling capacitance created by charging a VBL adjacent to a WL or CSL is not fixed. Instead, it is self-adjusting. That is, as the number of memory cells in each row increases (i.e., as the number of columns increases) so do the lengths of the VBLs, the WL and the CSL and, thus, so do any coupling capacitances created by charging the VBLs.

Figure 1B:
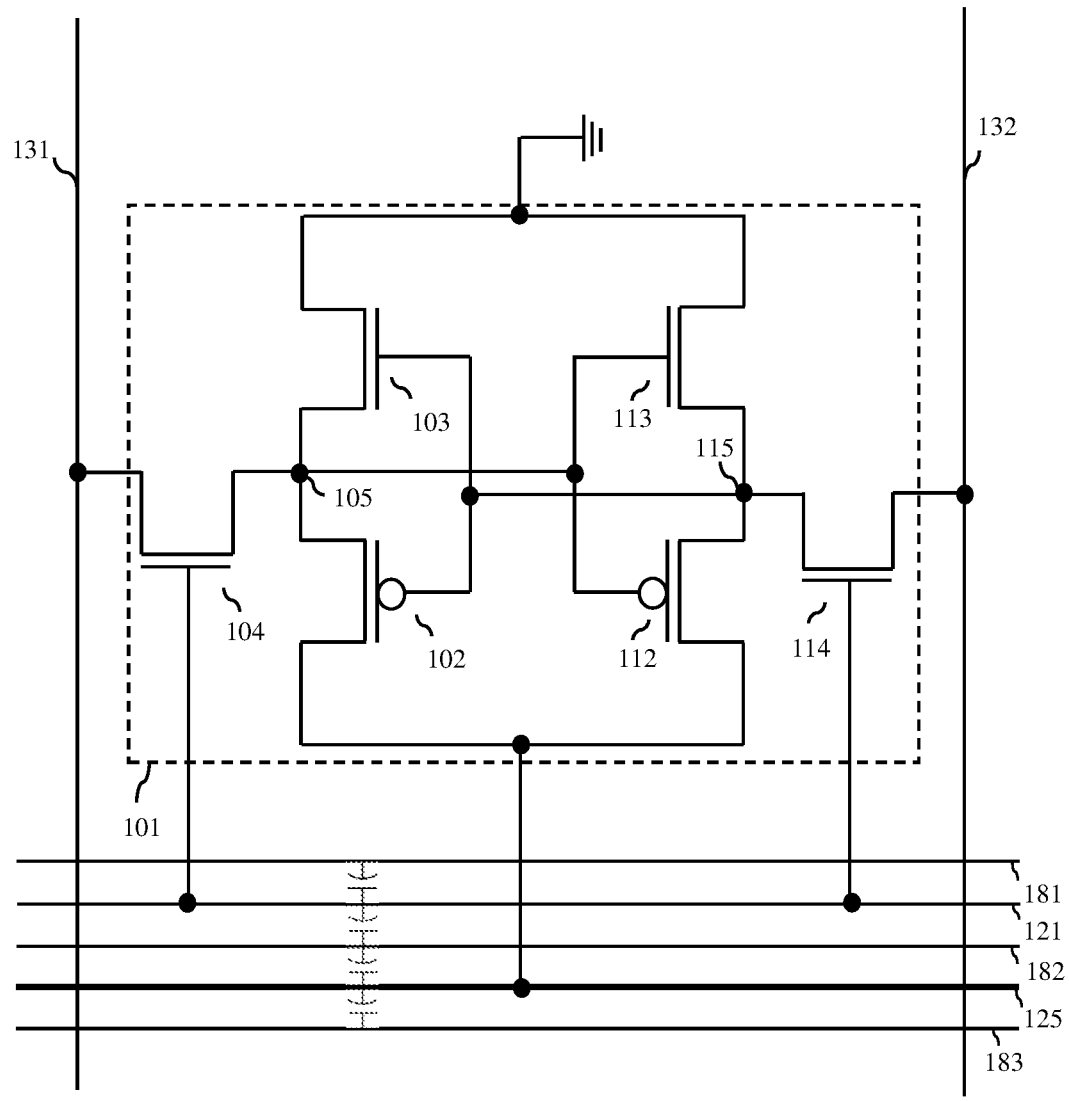
FIG. 1B is a schematic diagram illustrating an exemplary memory cell in a column of memory cells in the memory structure of FIG. 1A.
Figure 1C:
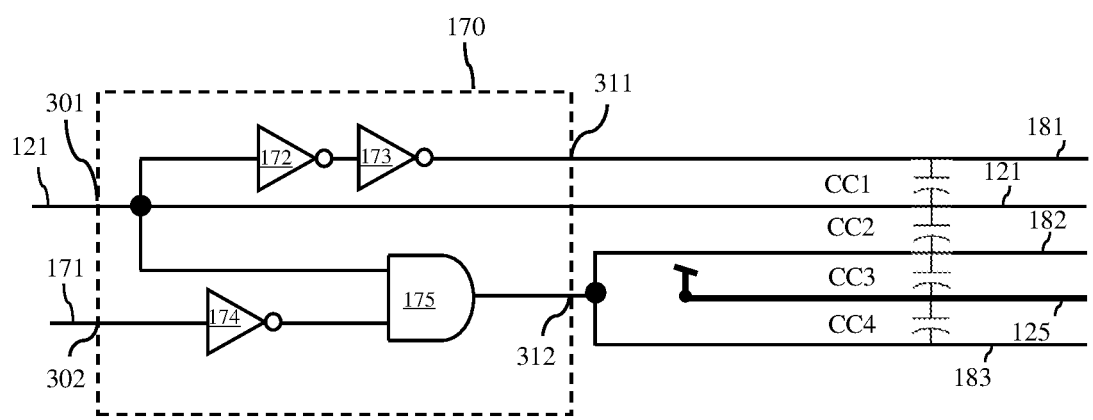
FIG. 1C is a schematic diagram illustrating a voltage boost circuit associated with a row of memory cells in the memory structure of FIG. 1A.
Figure 2A:
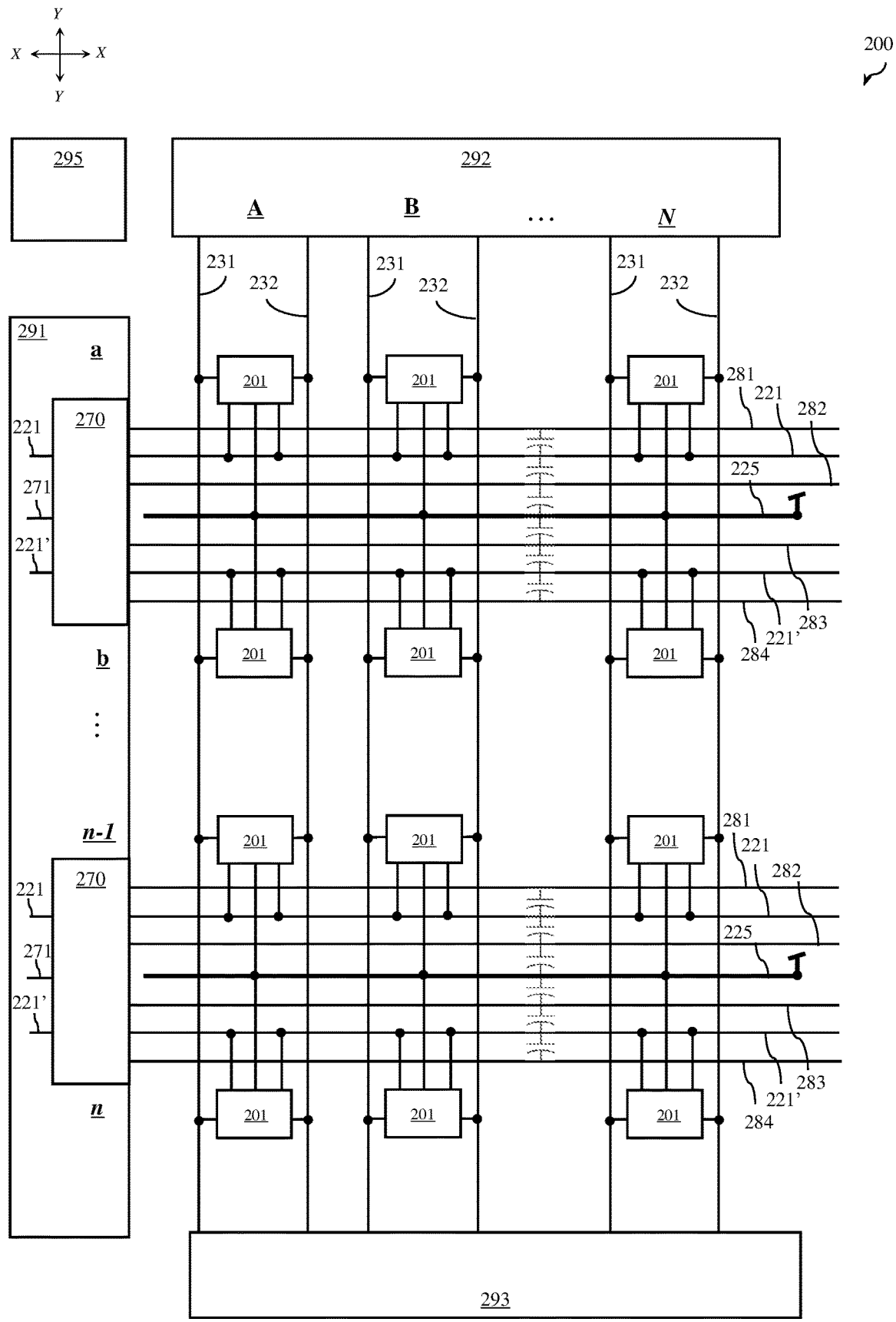
FIG. 2A is a schematic diagram illustrating another embodiment of a memory structure with self-adjusting capacitive coupling-based voltage boosting for read and write assists.
Figure 2B:
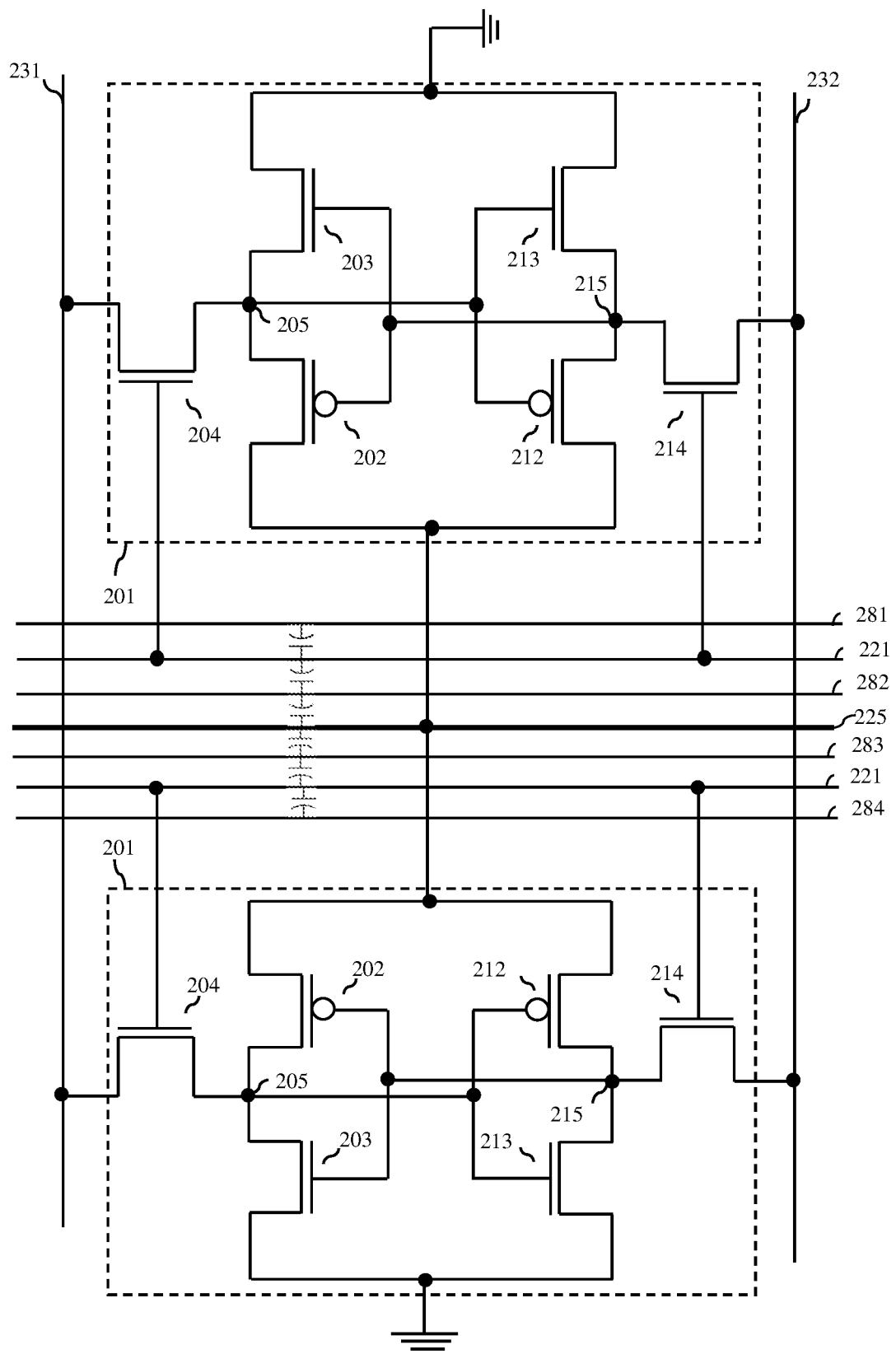
FIG. 2B is a schematic diagram illustrating an exemplary pair of adjacent memory cells in a column of memory cells in the memory structure of FIG. 2A.
Figure 2C:
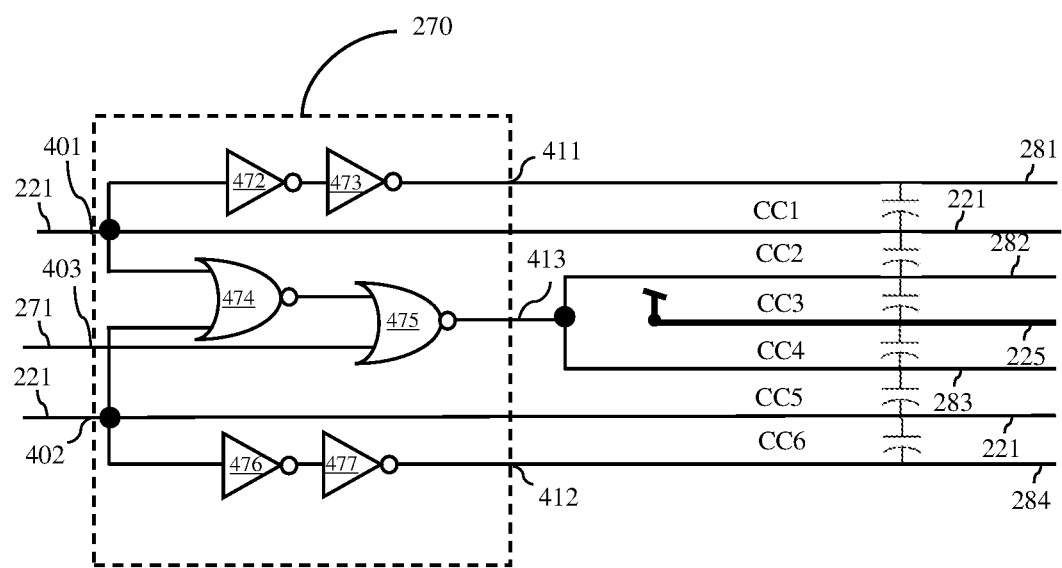
FIG. 2C is a schematic diagram illustrating a voltage boost circuit associated with adjacent rows of memory cells in the memory structure of FIG. 2A.

Generally, disclosed herein are various embodiments of a memory structure with self-adjusting capacitive coupling-based voltage boosting for read and write assists (e.g., see the memory structure 100 of FIGS. 1A-1C; see also the memory structure 200 of FIGS. 2A-2C).

The memory structure 100, 200 can include an array of memory cells 101, 201 arranged in rows (see rows a-n) and columns (see columns A-N). For example, the memory cells 101, 201 can be arranged in rows that are essentially parallel and oriented in a first direction and in columns that are essentially parallel and oriented in second direction that is perpendicular to the first direction. The first direction can be the X-direction and the second direction can be the Y-direction (as illustrated in the drawings) or vice versa.

The memory cells 101, 201 can be any suitable type of memory cell that is powered by a cell supply voltage (Vcs) (e.g., at a positive supply voltage (Vdd) level), that is accessed during read and write operations by switching a wordline voltage (Vwl) from ground to Vdd, that can be assisted during a read operation by increasing both Vwl and Vcs to Vdd+, and that can be assisted during a write operation by only increasing Vwl to Vdd+. Such memory cells 101, 201 can be, for example, static random access memory (SRAM) cells.

FIGS. 1B and 2B are schematic diagrams illustrating and exemplary six-transistor (6T) SRAM cells that could be incorporated into the memory structure 100, 200.

Each 6T-SRAM cell 101, 201 can include a first inverter, which includes a first pull-up transistor 102, 202 (e.g., a p-type field effect transistor (PFET)) and a first pull-down transistor 103, 203 (e.g., an n-type field effect transistor (NFET)) connected in series between a cell supply line (CSL) 125, 225 and ground. Each 6T-SRAM cell can further include a second inverter, which is cross-coupled to the first inverter and which includes a second pull-up transistor 112, 212 (e.g., a PFET) and a second pull-down transistor 113, 213 (e.g., an NFET) connected in series between the same CSL 125, 225 and ground. Those skilled in the art will recognize that, with the cross-coupled first and second inverters, the junction (also referred to herein as the first data storage node 105, 205 or true node) between the first pull-up transistor 102, 202 and the first pull-down transistor 103, 203 will be connected to (i.e., will control) the gates of the second pull-up transistor 112, 212 and the second pull-down transistor 113, 213. Furthermore, the junction (also referred to herein as the second data storage node 215 or complement node) between the second pull-up transistor 112, 212 and the second pull-down transistor 113, 213 will be connected to (i.e., will control) the gates of the first pull-up transistor 102, 202 and the first pull-down transistor 103, 203.

Each 6T-SRAM cell 101, 201 can further include: a first access transistor 104, 204 (also referred to herein as a first pass-gate transistor) (e.g., an NFET), which is connected in series between a first bitline, also referred to herein as a true bitline (BLT) 131, 231, for a column containing the SRAM cell and the first data storage node 105, 205 and which has a gate connected to a wordline (WL) 121, 221 for a row containing the SRAM cell; and a second access transistor 114, 214 (also referred to herein as a second pass-gate transistor), which is connected in series between a second bitline, also referred to herein as a complement bitline (BLC) 132, 232 for the column containing the SRAM cell and the second data storage node 115, 215 and which also has a gate connected to the WL 121, 221 for the row containing the SRAM cell.

Thus, a memory structure 100, 200 that includes an array of 6T-SRAM cells will also include: WLs 121, 221 for the rows a-n, respectively, where each WL for each row is connected to the gates of the first access transistor 104, 204 and the second access transistor 114, 214 of all the SRAM cells in that row; pairs of bitlines (BLT 131, 231 and BLC 132, 232) for the columns A-N, respectively, where BLT and BLC for each column are connected to the drain region of the first access transistor 104, 204 and the drain region of the second access transistor 114, 214, respectively; and CSLs 125, 225 for the rows a-n. It should be noted that, in some embodiments, each CSL 125 can be associated with a corresponding one of the rows with all the memory cells in that row and only that row being connected to the CSL 125 (e.g., see the memory structure 100 of FIGS. 1A-1C). However, in other embodiments, each CSL 225 can be shared between two adjacent rows with all of the memory cells in both rows being connected to the CSL (e.g., see the memory structure 200 of FIGS. 2A-2C), as discussed in greater detail below.

It should be noted that the figures are not intended to be limiting. While 6T-SRAM cells are described above and illustrated in the drawings, any other suitable type of memory cell could be incorporated into the array of the memory structure 100, 200. Such memory cells include, but are not limited to, 8T-SRAM cells, 10T-SRAM cells, etc.

In any case, in each of the embodiments, the memory structure 100, 200 can further include a controller 195, 295 and peripheral circuitry, which is connected to the array and which is configured to facilitate various memory functions (e.g., read operations and write operations with respect to selected memory cells in the array) in response to control signals from the controller 195, 295. As with conventional memory structures (e.g., conventional SRAM structures), the peripheral circuitry can include peripheral circuitry 191, 291 for the rows. The peripheral circuitry 191, 291 for the rows can be connected to the WLs 121, 221 for the rows a-n and can include, for example, a row decoder configured to facilitate WL activation (i.e., charging of a selected WL to a positive supply voltage (Vdd) level) in order to provide memory cell access during memory functions (e.g., read operations or write operations). The peripheral circuitry can also include peripheral circuitry 192, 292 for the columns. The peripheral circuitry 192, 292 for the columns can be connected to the BLT/BLC pairs 131-132, 231-232 for the columns A-N and can include a column decoder configured to facilitate BL biasing during the memory functions. Finally, the peripheral circuitry can include additional peripheral circuitry 193, 293, which is also electrically connected to the BLT/BLC pairs 131-132, 231-232 for the columns A-N and which includes a sense circuit configured to enable changes in BL electrical properties (e.g., voltage or current) to be sensed during read operations in order to determine stored data values within selected memory cells.

Such peripheral circuitry is generally known in the art and, thus, the details thereof have been omitted from this specification to allow the reader to focus on the salient aspects of the disclosed embodiments. However, as discussed in greater detail below, each of the embodiments of the memory structure 100, 200 also includes VBLs for the rows with each WL and each CSL being positioned between and parallel to two voltage boost lines. Therefore, in addition to known features, the peripheral circuitry 191, 291 for the rows also includes novel voltage boost circuits 170, 270 (described in greater detail below and illustrated, for example, in FIGS. 1C and 2C) for selectively charging the VBLs to enable capacitive coupling-based WL and/or CSL voltage boosting depending on whether a read assist or a write assist is required.

More specifically, referring to FIGS. 1A-1C, the memory structure 100 can further include multiple parallel conductive lines (i.e., metal lines or wires) within the same back end of the line BEOL) metal level. These parallel conductive lines can include, for each row a-n of memory cells 101 within the array, three voltage boost lines (VBLs) 181-183, a wordline (WL) 121, and a cell supply line (CSL) 125. Specifically, the parallel conductive lines can include: a first VBL 181, a WL 121, a second VBL 182, a CSL 125, and a third VBL 183. The WL 121 and the CSL 125 for the row can both be connected (as discussed above) to all memory cells 101 in that row. The WL 121 can be positioned between and parallel to the first VBL 181 and the second VBL 182. The CSL 125 can be positioned between and parallel to the second VBL 182 and the third VBL 183. As mentioned above, these parallel conductive lines can be in the same BEOL metal level. Each conductive line can be separated from the adjacent conductive line(s) by a thin layer of interlayer dielectric (ILD) material such that each pair of adjacent conductive lines form a capacitor.

The memory structure 100 can further include voltage boost circuits 170 for the rows a-n, respectively. Each voltage boost circuit 170 can include a first node connected to the WL 121 for the row and a second input node for receiving a mode select signal 171 (e.g., from the controller 195), which indicates either a read mode (e.g., with a low logic or "0" value) or a write mode e.g., with a high logic or "1" value). Each voltage boost circuit 170 can further include a first output node connected to the first VBL 181 and a second output node connected to both the second VBL 182 and the third VBL 183.

Each voltage boost circuit 170 for each row can be configured so that, when Vwl on the WL 121 for the row switches to the Vdd level (as detected at the first input node) at the initiation of a read or write operation and when the mode select signal (as detected at the second input node) indicates the read mode, the first VBL 181 is charged (e.g., from ground to a high positive voltage level) through the first output node and the second VBL 182, and the third VBL 183 are similarly charged (e.g., from ground to the high positive voltage level) through the second output node. Charging the three VBLs 181-183 for the row creates coupling capacitances (CC1 and CC2) between the WL 121 and both the first VBL 181 and the second VBL 182 to increase the Vwl on the WL 121 above the VDD level (i.e., to some Vdd+) and further creates additional coupling capacitances (CC3 and CC4) between the CSL 125 and both the second VBL 182 and the third VBL 183 to increase Vcs on the CSL 125 above Vdd level (i.e., to some Vdd+). That is, during a read operation, two units of CC impact the WL and two units of CC impact the CSL.

Each voltage boost circuit 170 for each row can further be configured so that, when Vwl on the WL 121 switches to the Vdd level (as detected at the first input node) at the initiation of a read or write operation but the mode select signal (as detected at the second input node) indicates the write mode, only the first VBL 181 is charged (e.g., from ground to a high positive voltage level) through the first output node. Charging the first VBL 181 only creates a coupling capacitance (CC1) between the WL and the first VBL 181 only to increase the Vwl on the WL 121 above the Vdd level without increasing the Vcs on the CSL 125. That is, during a read operation, only one unit of CC impacts the WL and no units of CC impact the CSL.

Each voltage boost circuit 170 for each row can further be configured so that, when a Vwl on the WL 121 is uncharged (e.g., when the WL is discharged to ground) (as detected at the first input node) such that none of the memory cells in the row are being subjected to a read or write operation, none of the three VBLs 181-183 will be charged by the voltage boost circuit 170. By keeping the three VBLs 181-183 uncharged, coupling capacitances with the WL and CSL are not created. Thus, the WL 121 will remain at ground and CSL 125 will not be boosted above the Vdd level.

FIG. 1C is a schematic diagram illustrating an exemplary voltage boost circuit 170 that could be incorporated into the memory structure 100. The voltage boost circuit 170 can be a digital voltage boost circuit. This exemplary voltage boost circuit 170 includes a first input node 301, which is connected to a WL 121 and a first output node 311, which is connected to the first VBL 181. This exemplary voltage boost circuit 170 can further include a pair of inverters 172 and 173 connected in series between the first input node 301 and the first output node 311. This exemplary voltage boost circuit 170 can further include a second input node 302, which receives a mode select signal 171, and a second output node 312, which is connected to both the second VBL 182 and the third VBL 183. This exemplary voltage boost circuit 170 can further an inverter 174, which receives the mode select signal 171 as an input signal through the second input node 302. This exemplary voltage boost circuit 170 can further include an AND gate that receives, as input signals, both the Vwl signal from the first input node 301 and the output signal from the inverter 174.

Those skilled in the art will recognize that the output signal from the two series-connected inverters 172-173 at the first output node 311 will correspond to the input signal (i.e., Vwl) at the first input node 301. That is, if Vwl is low, the output signal at the first output node will be low and vice versa. Those skilled in the art will also recognize that the output signal from the NAND gate 175 at the second output node will be low unless both input signals to the NAND gate 175 are high. Thus, in such a digital voltage boost circuit, if Vwl at the first input node 301 is low, the output signals at the first output node 311 and the second output node 312 will both be low and none of the VBLs 181-183 will be charged and no voltage-boosting coupling capacitances are created. If Vwl at the first input node 301 is high and the mode select signal 171 at the second input node 302 is low (indicating a read mode), then: (a) the output signal at the first output node 311 will be high; and (b) given the inverter 174, the input signals to the NAND gate 175 will both be high and the output signal at the second output node 312 will also be high. Thus, all three of the VBLs 181-183 will be charged, thereby creating the coupling capacitances CC1-CC4 described above and boosting Vwl on the WL 121 and Vcs on the CSL 125. If Vwl at the first input node 301 is high and the mode select signal 171 at the second input node 302 is also high (indicating a write mode), then: (a) the output signal at the first output node 311 will be high; but (b) given the inverter 174, the input signals to the NAND gate 175 will be high and low and the output signal at the second output node 312 will be low. Thus, only the first VBL 181 will be charged, thereby only creating the coupling capacitance CC1 and boosting Vwl on WL 121.

In the memory structure 100, described above, each row has a corresponding CSL 125 and voltage boost circuit 170. In other embodiments and, particularly, in the memory structure 200, a CSL and voltage boost circuit can be shared between a pair of adjacent rows (e.g., between row a and row b, . . . , between row n−1 and row n).

More specifically, referring to FIGS. 2A-2C, the memory structure 200 can further include multiple parallel conductive lines (i.e., metal lines or wires) within the same back end of the line BEOL) metal level. These parallel conductive lines can include, for each pair adjacent row e.g., for adjacent rows a and b, c and d, e and f, . . . , n−1 and n) of memory cells 101 within the array, four voltage boost lines (VBLs) 281-284, two wordlines (WLs) (one for each row of the pair of adjacent rows), and a shared cell supply line (CSL) 225. Specifically, the parallel conductive lines can include: a first VBL 281, a first WL 221 for a first row of the pair of adjacent rows, a second VBL 282, a shared CSL 225, a third VBL 283, a second WL 221' for the second row of the pair of adjacent rows, and a fourth VBL 284. The first WL 221 for the first row in the pair of adjacent rows and the CSL 225, which is shared between first and second rows of the pair of adjacent rows, can both be connected (as discussed above) to all memory cells 201. Furthermore, second WL 221' for the second row of the pair of adjacent rows and the CSL 225, which is shared between the first and second rows of the pair of adjacent rows, can both be connected (as discussed above) to all memory cells 201. The first WL 221 can be positioned between and parallel to the first VBL 281 and the second VBL 282. The CSL 225 can be positioned between and parallel to the second VBL 282 and the third VBL 283. The second WL 221' can be positioned between and parallel to the third VBL 283 and the fourth VBL 284. As mentioned above, these parallel conductive lines can be in the same BEOL metal level. Each conductive line can be separated from the adjacent conductive line(s) by a thin layer of interlayer dielectric (ILD) material such that each pair of adjacent conductive lines form a capacitor.

The memory structure 200 can further include voltage boost circuits 270 for the pairs of adjacent rows (e.g., rows a and b, c and d, . . . n−1 and n), respectively. Each voltage boost circuit 270 can include a first node connected to the first WL 221 for the first row of the pair of adjacent rows, a second input node connected to the second WL 221' for the second row of the pair of adjacent rows, and a third input node for receiving a mode select signal 271 (e.g., from the controller 295), which indicates either a read mode (e.g., with a low logic or "0" value) or a write mode e.g., with a high logic or "1" value). Each voltage boost circuit 270 can further include a first output node connected to the first VBL 281, a second output node connected to the fourth VBL 284, and a third output node connected to both the second VBL 282 and the third VBL 283.

Each voltage boost circuit 270 for each pair of adjacent rows (e.g., rows a and b, c and d, . . . n−1 and n) can be configured so that, when a first Vwl on the first WL 221 for the first row switches to the Vdd level (as detected at the first input node) at the initiation of a read or write operation directed to a memory cell in that first row and when the mode select signal (as detected at the third input node)

indicates the read mode, the first VBL 281 is charged (e.g., from ground to a high positive voltage level) through the first output node and the second VBL 282 and the third VBL 283 are similarly charged (e.g., from ground to the high positive voltage level) through the third output node. Charging the three VBLs 281-283 creates coupling capacitances (CC1 and CC2) between the first WL 221 and both the first VBL 281 and the second VBL 282 to increase the first Vwl on the first WL 221 above the VDD level (i.e., to some Vdd+) and further creates additional coupling capacitances (CC3 and CC4) between the CSL 225 and both the second VBL 282 and the third VBL 283 to increase Vcs on the CSL 225 above Vdd level (i.e., to some Vdd+). Since only one WL within the array will typically be selected at a given time, if the first Vwl on the first WL 221 is high, the second Vwl on the second WL 221' will be low.

Each voltage boost circuit 270 for each pair of adjacent rows (e.g., rows a and b, c and d, . . . n−1 and n) can also be configured so that, when the second Vwl on the second WL 221' for the second row switches to the Vdd level (as detected at the second input node) at the initiation of a read or write operation directed to a memory cell in that second row and when the mode select signal (as detected at the third input node) indicates the read mode, the fourth VBL 284 is charged (e.g., from ground to a high positive voltage level) through the second output node and the second VBL 282 and the third VBL 283 are similarly charged (e.g., from ground to the high positive voltage level) through the third output node. Charging the three VBLs 282-284 creates coupling capacitances (CC5 and CC6) between the second WL 221' and both the third VBL 283 and the fourth VBL 284 to increase the second Vwl on the second WL 221' above the VDD level (i.e., to some Vdd+) and further creates additional coupling capacitances (CC3 and CC4) between the CSL 225 and both the second VBL 282 and the third VBL 283 to increase Vcs on the CSL 225 above Vdd level (i.e., to some Vdd+). Again, only one WL within the array will typically be selected at a given time, so if the second Vwl on the second WL 221' is high, the first Vwl on the first WL 221 will be low. Thus, for read operations, two units of CC impact the selected one of the WLs and two units of CC also impact the shared CSL.

Each voltage boost circuit 270 for each pair of adjacent rows (e.g., rows a and b, c and d, . . . n−1 and n) can also be configured so that, when the first Vwl on the first WL 221 switches to the Vdd level (as detected at the first input node) at the initiation of a read or write operation but the mode select signal (as detected at the third input node) indicates the write mode, only the first VBL 281 is charged (e.g., from ground to a high positive voltage level) through the first output node. Charging the first VBL 281 only creates a coupling capacitance (CC1) between the first WL and the first VBL 281 only to increase the first Vwl on the first WL 221 above the Vdd level without increasing the Vcs on the CSL 225. Again, only one WL within the array will typically be selected at a given time, so if the first Vwl on the first WL 221 is high, the second Vwl on the second WL 221' will be low. Each voltage boost circuit 270 for each pair of adjacent rows (e.g., rows a and b, c and d, . . . n−1 and n) can also be configured so that, when the second Vwl on the second WL 221' switches to the Vdd level (as detected at the fourth input node) at the initiation of a read or write operation but the mode select signal (as detected at the third input node) indicates the write mode, only the fourth VBL 284 is charged (e.g., from ground to a high positive voltage level) through the second output node. Charging the fourth VBL 284 only creates a coupling capacitance (CC6) between the second WL and the fourth VBL 284 only to increase the second Vwl on the second WL 221' above the Vdd level without increasing the Vcs on the CSL 225. Again, only one WL within the array will typically be selected at a given time, so if the second Vwl on the second WL 221' is high, the first Vwl on the first WL 221 will be low. Thus, for write operations, one unit of CC impacts the selected one of the WLs and no CC impacts the shared CSL.

Each voltage boost circuit 270 for each pair of adjacent rows (e.g., rows a and b, c and d, . . . n−1 and n) can also be configured so that, when both the first Vwl on the first WL 221 and the second Vwl on the second WL 221' are uncharged (e.g., discharged to ground) (as detected at the first input node and the second input node) such that none of the memory cells in either the first row or the second row of the pair are being subjected to a read or write operation and none of the four VBLs 281-284 are charged through the voltage boost circuit 270. By keeping the four VBLs 281-284 uncharged, coupling capacitances with the two WLs and the shared CSL are not created. Thus, the two WLs will remain at ground and the share CSL 225 will not be boosted above the Vdd level.

FIG. 2C is a schematic diagram illustrating an exemplary voltage boost circuit 270 that could be incorporated into the memory structure 200. The voltage boost circuit 270 can be a digital voltage boost circuit. This exemplary voltage boost circuit 270 includes a first input node 401, which is connected to the first WL 221 and a first output node 411, which is connected to the first VBL 281. This exemplary voltage boost circuit 270 includes a second input node 402, which is connected to the second WL 221' and a second output node 412, which is connected to the fourth VBL 284. This exemplary voltage boost circuit 270 can further include a first pair of inverters 472 and 473 connected in series between the first input node 401 and the first output node 411. This exemplary voltage boost circuit 270 can further include a second pair of inverters 476 and 477 connected in series between the second input node 402 and the second output node 412. This exemplary voltage boost circuit 270 can further include a third input node 403, which receives a mode select signal 271, and a third output node 413, which is connected to both the second VBL 282 and the third VBL 283. This exemplary voltage boost circuit 270 can further include a NOR gate 474, which receives, as input signals, the first Vwl of the first WL 221 from the first input node 401 and the second Vwl of the second WL 221' from the second input node 402. This exemplary voltage boost circuit 270 can further include an additional NOR gate 475, which receives, as input signals, an output signal from the NOR gate 474 and the mode select signal 271.

Those skilled in the art will recognize that the output signal from the two series-connected inverters 472-473 at the first output node 411 will correspond to the input signal (i.e., first Vwl) at the first input node 401. That is, if the first Vwl is low, the output signal at the first output node 411 will be low and vice versa. Similarly, the output signal from the two series-connected inverters 476-477 at the second output node 412 will correspond to the input signal (i.e., second Vwl) at the second input node 402. That is, if the second Vwl is low, the output signal at the second output node 412 will be low and vice versa. Those skilled in the art will also recognize that the output signal from a NOR gate will be low unless both input signals to the NOR gate are also low and then the output signal will be high.

In such a digital voltage boost circuit 270, if the first Vwl at the first input node 401 and the second Vwl at the second input node 402 are both low, then the output signal from the NOR gate 474 will be high and, thus, the output signal from the additional NOR gate 475 will be low (regardless of the logic value of the mode select signal 271) and none of the VBLs 281-284 will be charged and no voltage-boosting coupling capacitances are created.

If the first Vwl at the first input node 401 is high, the second Vwl at the second input node 402 is low, and the mode select signal 271 at the third input node 403 is low (indicating a read mode), then: (a) the output signal at the first output nod 411 will be high; (b) the input signals to the NOR gate 474 are high and low so the output signal from the NOR gate 474 will be low; and (c) the input signals to the additional NOR gate 475 are both low so the output signal from the additional NOR gate 475 is high. Thus, the first, second and third boost lines 281-283 will be charged, thereby creating the coupling capacitances CC1-CC4 described above and boosting the first Vwl on the first WL 221 and Vcs on the shared CSL 225. Furthermore, the output signal from the pair of inverters 476-477 at the second output node 412 will be low so the fourth VBL 283 is not charged. Similarly, if the second Vwl at the second input node 402 is high, the first Vwl at the first input node 401 is low, and the mode select signal 271 at the third input node 403 is low (indicating a read mode), then: (a) the output signal at the second output node 412 will be high; (b) the input signals to the NOR gate 474 are low and high so the output signal from the NOR gate 474 will be low; and (c) the input signals to the additional NOR gate 475 are both low so the output signal from the additional NOR gate 475 is high. Thus, the second, third and fourth boost lines 282-284 will be charged, thereby creating the coupling capacitances CC3-CC6 described above and boosting the second Vwl on the second WL 221' and Vcs on the shared CSL 225. Furthermore, the output signal from the pair of inverters 472-473 at the first output node 411 will be low so the first VBL 281 is not charged.

If the first Vwl at the first input node 401 is high, the second Vwl at the second input node 402 is low, and the mode select signal 271 at the third input node 403 is high (indicating a write mode), then: (a) the output signal at the first output node 411 will be high; (b) the output signal at the second output node 412 will be low; (c) the input signals to the NOR gate 474 will be high and low so the output signal will be low; and (d) the input signals to the additional NOR gate 475 will be low and high so the output signal at the third output node 413 will be low. Thus, only the first VBL 281 will be charged, thereby only creating the coupling capacitance CC1 and boosting the first Vwl on the first WL 221. Similarly, if the first Vwl at the first input node 401 is low, the second Vwl at the second input node 402 is high, and the mode select signal 271 at the third input node 403 is high (indicating a write mode), then: (a) the output signal at the first output node 411 will be low; (b) the output signal at the second output node 412 will be high; (c) the input signals to the NOR gate 474 will be low and high so the output signal will be low; and (d) the input signals to the additional NOR gate 475 will again be low and high so the output signal at the third output node 413 will be low. Thus, only the fourth VBL 284 will be charged, thereby only creating the coupling capacitance CC6 and boosting the second Vwl on the second WL 221'.

It should be noted that in the memory structure 100, 200, the voltage boost circuits 170, 270 can be integrated into the peripheral circuitry 191, 291 for the rows a-n at one end, for example, at the same end as the wordline drivers, etc., as illustrated. Alternatively, the voltage boost circuits 170, 270 could be integrated into the peripheral circuitry 191, 291 for the rows a-n at some other location (e.g., at the end of the rows opposite the wordline drivers, midway along the rows, etc.).

Design of such a memory structure can be performed using, for example, a process design kit (PDK). For purposes of this disclosure, a PDK refers to a set of electronic files (including both data and script files), which is developed (e.g., by a semiconductor foundry) for its customers to facilitate design of integrated circuit (IC) chips at a specific technology node supported by the foundry. The electronic files are accessible by one or more electronic design automation (EDA) tools executed on a computer network (e.g., on a computer-aided design (CAD) system) at different stages in the design flow. Exemplary PDK electronic files can include, but are not limited to, simulation models, symbols and technology files for the specific technology node, libraries (e.g., a standard cell library, a parameterized cell (Pcell) library, etc.) and design rule decks, etc. for different stages in the chip design flow (e.g., for floorplanning, power planning, input/output pin placement, library element placement, clock planning, wire routing, a layout versus schematic (LVS) check, 3D emulation, simulations, etc.). Design of the memory structure can include, for example: selection of library elements that correspond to the desired memory cell structure and other memory circuit devices (e.g., drivers, voltage boost circuits, etc.); placement of the library elements; and subsequent routing of the parallel conductive lines for each row or pairs of rows in one of the BEOL metal levels and of the above-described connections to the memory cells, voltage boost circuits, etc. Alternatively, design of the memory structure can include, for example: selection of library elements that correspond to a desired memory cell structure with the routing of the parallel conductive lines already included and other memory circuit devices (e.g., drivers, voltage boost circuits, etc.); placement of the library elements, and subsequent routing of any remaining wiring required. In any case, in each embodiment of the memory structure, the coupling capacitance created by charging a VBL is not fixed due to the selection and/or programming of a specific device. Instead, it is self-adjusting. That is, as the number of memory cells in each row increases (i.e., as the number of columns increases) during design so does the coupling capacitance that will be employed for read and write assist or vice versa.

More specifically, a significant benefit of the disclosed embodiments is that, when the number of bitcell columns with an array changes during design, coupling capacitances due to charging of the first, second and third VBLs 181-183, 281-283 during read operations and due to charging of the first VBL 181, 281 only during write operations will be automatically scaled with the ratio of added coupling capacitances remaining the same. That is, during a read operation, two units of coupling capacitance boost the voltage on the WL (e.g., one from the charged first VBL and one from the charged second VBL) and two units of coupling capacitance boost the voltage on the CSL (e.g., one from the charged second VBL and one from the charged third VBL) regardless of the column; whereas, during a write operation, one unit of coupling capacitance boosts the voltage on the WL (e.g., one only from the charged first VBL) and zero units of coupling capacitance boost the voltage on the CSL (i.e., the CSL remains at Vdd) regardless of the number of columns. It should be noted that, when there are fewer numbers of columns, ground-cap on WL and CSL will be smaller and coupling-cap due to the second and third voltage boost lines will also be smaller; whereas, when there are larger numbers of columns, ground-cap on WL and CSL will be larger and coupling-cap due to the second and third lines will also be larger.

Figure 3A:
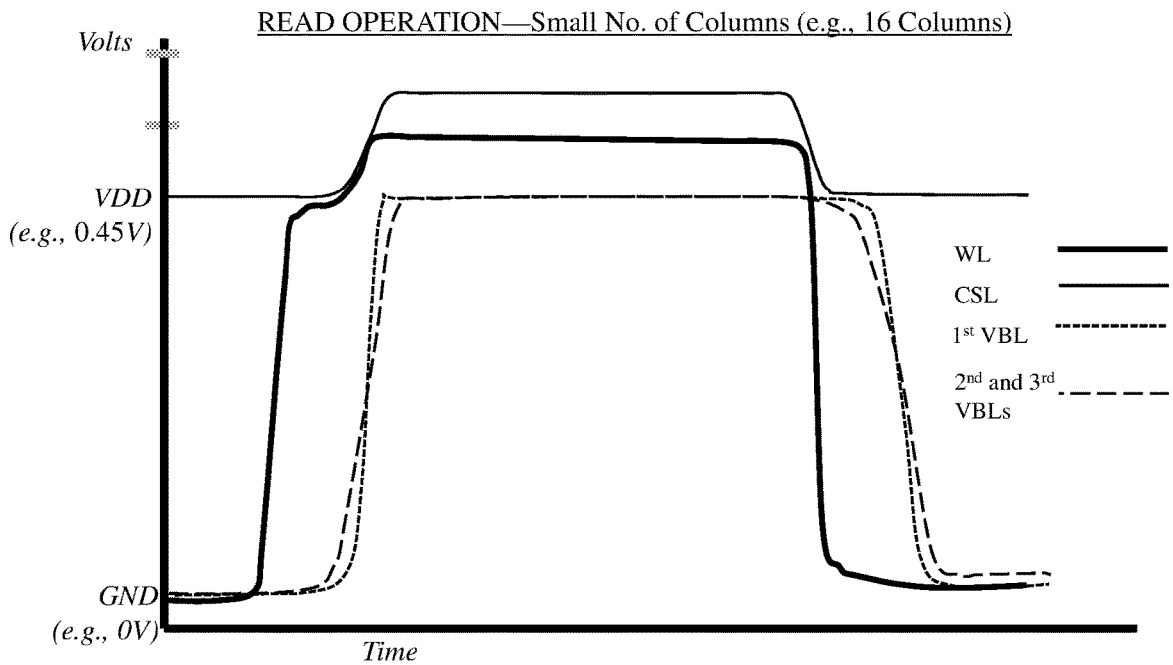
FIGS. 3A and 3B are diagrams illustrating voltage levels on a wordline (WL), on a cell supply line (CSL), and on three voltage boost lines (VBLs) during read and write operations, respectively, in a disclosed memory structure having a relatively small number of columns.
Figure 3B:
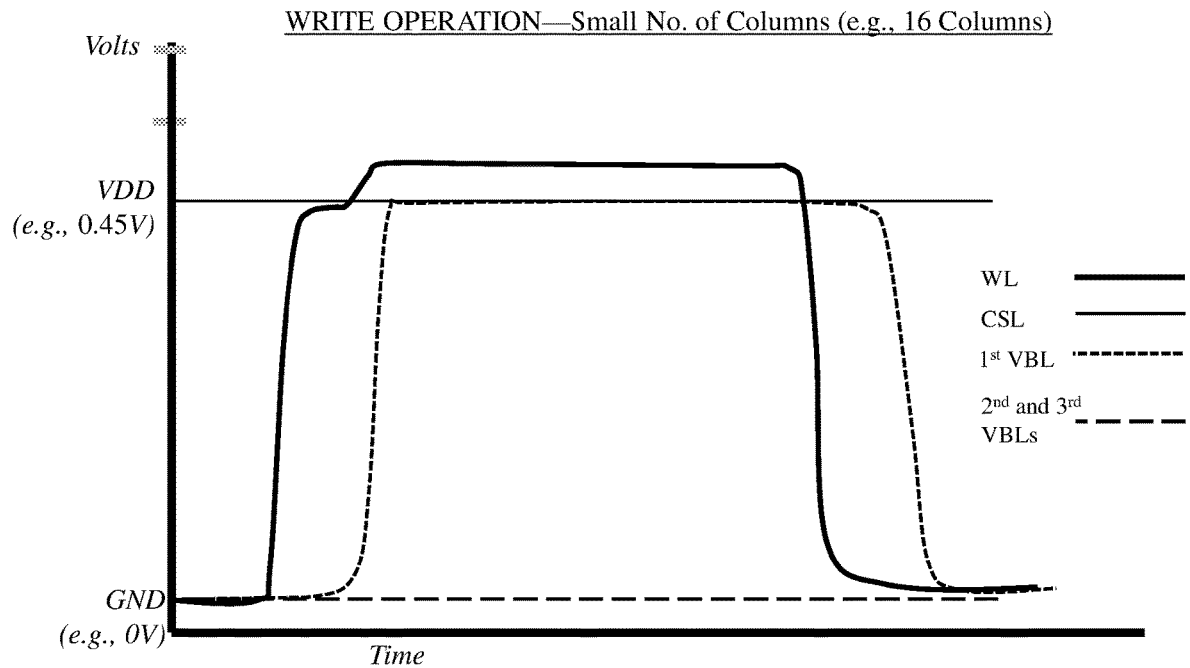

FIGS. 3A and 3B are exemplary diagrams illustrating voltage levels on a WL 121, 221, on a CSL 125, 225, on the first VBL 181, 281, and on the second and third VBLs 182, 282 and 183, 283 during read and write operations, respectively, in an array with a relatively small number of columns (e.g., 16 columns). During the read operation, charging of the VBLs to a Vdd of, for example, 450 mV can result in coupling-capacitance assisted boost of the voltage level on the WL from 450 mV up to 532 mV and a coupling-capacitance assisted boost of the voltage level on the CSL from 450 mV to 558 mV; whereas, during the write operation, charging of only the first VBL to 450 mV can result in a coupling-capacitance assisted boost on the WL of approximately half that amount seen in the read operation (e.g., from 450 mV to 491 mV) with the CSL and second and third VBLs remaining constant at Vdd.

Figure 4A:
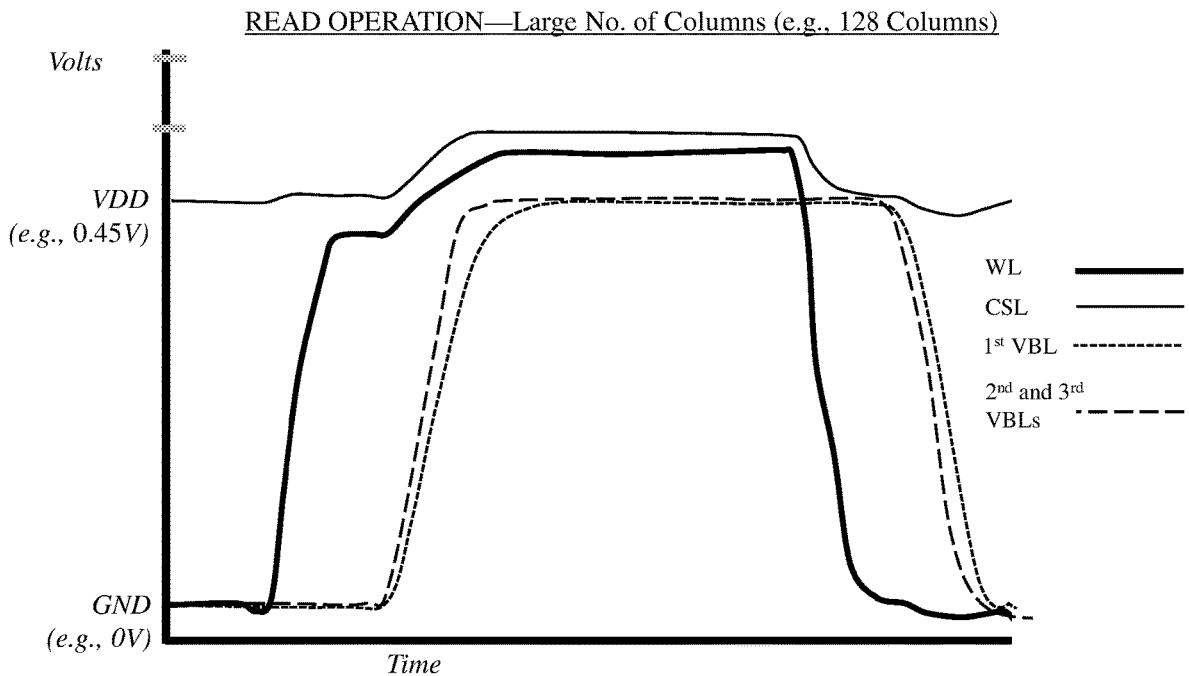
FIGS. 4A and 4B are diagrams illustrating voltage levels on a wordline (WL), on a cell supply line (CSL), and on three voltage boost lines (VBLs) during read and write operations, respectively, in a disclosed memory structure having a relatively large number of columns.
Figure 4B:
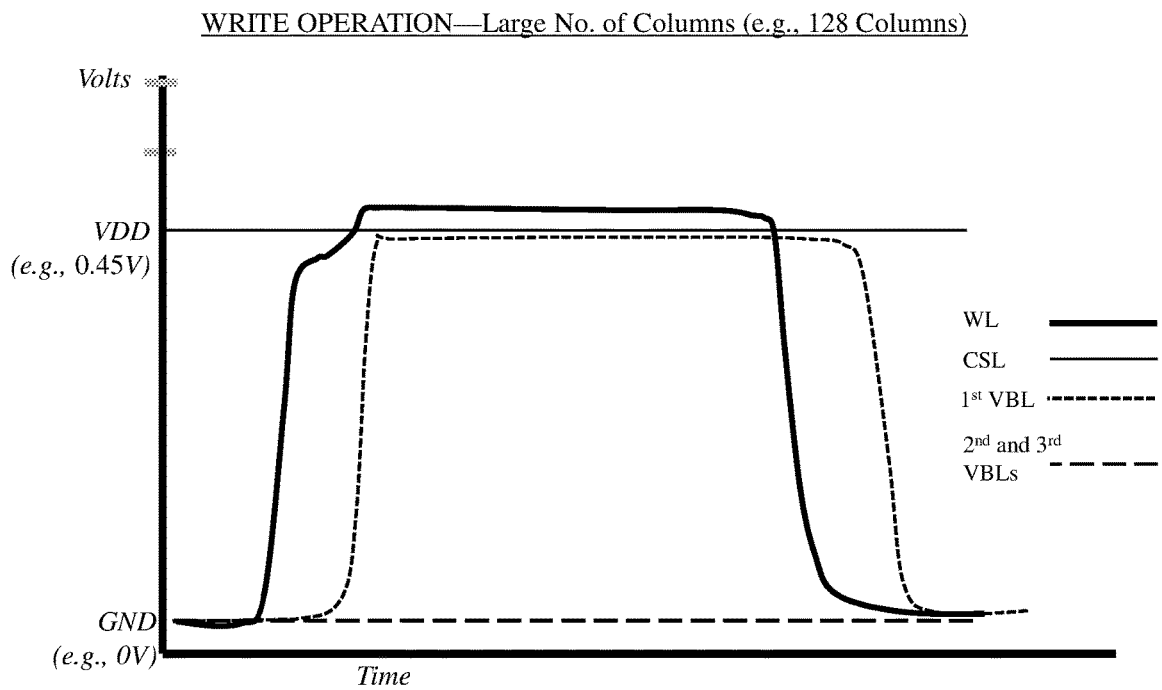

FIGS. 4A and 4B are exemplary diagrams illustrating voltage levels on a WL 121, 221, on a CSL 125, 225, on the first VBL 181, 281, and on the second and third VBLs 182, 282 and 183, 283 during read and write operations, respectively, in an array with a relatively large number of columns (e.g., 128 columns). The voltage boosts seen during the read and write operations are slightly less but the coupling capacitance ratio is still essentially the same. During the read operation, charging of the VBLs to a Vdd of, for example, 450 mV can result in coupling-capacitance assisted boost of the voltage level on the WL from 450 mV up to 525 mV and a coupling-capacitance assisted boost of the voltage level on the CSL from 450 mV to 542 mV; whereas, during the write operation, charging of only the first VBL to 450 mV can result in a coupling-capacitance assisted boost on the WL of approximately half the amount seen during the read operation (e.g., from 450 mV to 488 mV) with the CSL and second and third VBLs remaining constant at Vdd.

Thus, the disclosed memory structure allows for a fine-grained fixed voltage boost as the number of columns change during design.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory structure comprising:
    a first voltage boost line;
    a wordline;
    a second voltage boost line, wherein the wordline is between and parallel to the first voltage boost line and the second voltage boost line;
    a cell supply line;
    a third voltage boost line, where the cell supply line is between and parallel to the second voltage boost line and the third voltage boost line; and
    a voltage boost circuit connected to the first voltage boost line, the wordline, the second voltage boost line, and the third voltage boost line.

2. The memory structure of claim 1, further comprising: a row of memory cells, wherein each memory cell in the row is connected to the wordline and to the cell supply line and wherein the first voltage boost line, the second voltage boost line, and the third voltage boost line extend a length of the row.

3. The memory structure of claim 2, wherein the memory cells comprise static random access memory cells.

4. The memory structure of claim 1, wherein the voltage boost circuit is configured to receive a mode select signal that indicates one of a read mode and a write mode.

5. The memory structure of claim 4, wherein the voltage boost circuit is configured so that, when a wordline voltage on the wordline switches to a positive supply voltage level and the mode select signal indicates the read mode, the first voltage boost line, the second voltage boost line, and the third voltage boost line are charged creating coupling capacitances between the wordline and both the first voltage boost line and the second voltage boost line to increase the wordline voltage on the wordline above the positive supply voltage level and creating coupling capacitances between the cell supply line and both the second voltage boost line and the third voltage boost line to increase a cell supply voltage on the cell supply line above the positive supply voltage level.

6. The memory structure of claim 4, wherein the voltage boost circuit is configured so that, when a wordline voltage on the wordline switches to a positive supply voltage level and the mode select signal indicates the write mode, the first voltage boost line is charged creating a coupling capacitance between the wordline and the first voltage boost line to increase the wordline voltage on the wordline above the positive supply voltage level without increasing a cell supply voltage on the cell supply line.

7. The memory structure of claim 4, wherein the voltage boost circuit is configured so that, when a wordline voltage on the wordline is below a positive supply voltage level, the first voltage boost line, the second voltage boost line and the third voltage boost line are not charged by the voltage boost circuit.

8. A memory structure comprising:
a first voltage boost line;
a first wordline;
a second voltage boost line, wherein the first wordline is between and parallel to the first voltage boost line and the second voltage boost line;
a cell supply line;
a third voltage boost line, where the cell supply line is between and parallel to the second voltage boost line and the third voltage boost line;
a second wordline;
a fourth voltage boost line, wherein the second wordline is between and parallel to the third voltage boost line and the fourth voltage boost line; and
a voltage boost circuit connected to the first voltage boost line, the first wordline, the second voltage boost line, the third voltage boost line, the second wordline, and the fourth voltage boost line.

9. The memory structure of claim 8, further comprising multiple rows of memory cells, wherein the multiple rows comprise:
a first row of memory cells, wherein each memory cell in the first row is connected to the first wordline and to the cell supply line; and
a second row of memory cells adjacent to the first row, wherein each memory cell in the second row is connected to the second wordline and to the cell supply line,
wherein the first voltage boost line, the second voltage boost line, the third voltage boost line, and the fourth boost line extend a length of the rows.

10. The memory structure of claim 9, wherein the memory cells comprise static random access memory cells.

11. The memory structure of claim 8, wherein the voltage boost circuit is configured to receive a mode select signal that indicates one of a read mode and a write mode.

12. The memory structure of claim 11,
wherein the voltage boost circuit is configured so that, when a first wordline voltage on the wordline switches to a positive supply voltage level and the mode select signal indicates the read mode, the first voltage boost line, the second voltage boost line, and the third voltage boost line are charged creating coupling capacitances between the first wordline and both the first voltage boost line and the second voltage boost line to increase the first wordline voltage on the first wordline above the positive supply voltage level and creating coupling capacitances between the cell supply line and both the second voltage boost line and the third voltage boost line to increase a cell supply voltage on the cell supply line above the positive supply voltage level, and
wherein the voltage boost circuit is configured so that, when the first wordline voltage on the wordline switches to the positive supply voltage level and the mode select signal indicates the write mode, the first voltage boost line is charged creating a coupling capacitance between the first wordline and the first voltage boost line to increase the first wordline voltage on the first wordline above the positive supply voltage level without increasing the cell supply voltage on the cell supply line.

13. The memory structure of claim 11,
wherein the voltage boost circuit is configured so that, when a second wordline voltage on the second wordline switches to a positive supply voltage level and the mode select signal indicates the read mode, the fourth voltage boost line, the second voltage boost line, and the third voltage boost line are charged creating coupling capacitances between the second wordline and both the fourth voltage boost line and the third voltage boost line to increase the second wordline voltage on the second wordline above the positive supply voltage level and creating coupling capacitances between the cell supply line and both the second voltage boost line and the third voltage boost line to increase a cell supply voltage on the cell supply line above the positive supply voltage level, and
wherein the voltage boost circuit is configured so that, when the second wordline voltage on the second wordline switches to the positive supply voltage level and the mode select signal indicates the write mode, the fourth voltage boost line is charged creating a coupling capacitance between the second wordline and the fourth voltage boost line to increase the second wordline voltage on the first wordline above the positive supply voltage level without increasing the cell supply voltage.

14. The memory structure of claim 11, wherein the voltage boost circuit is configured so that, when a first wordline voltage on the first wordline and a second wordline voltage on the second wordline are below a positive supply voltage level, the first voltage boost line, the second voltage boost line, the third voltage boost line and the fourth voltage boost line are not charged by the voltage boost circuit.

15. The memory structure of claim 11, wherein the voltage boost circuit further comprises:
a first input node connected to the first wordline;
a second input node connected to the second wordline;
a third input node that receives a mode select signal;
a first output node connected to the first voltage boost line;
a second output node connected to the fourth voltage boost line;
a third output node connected to the second voltage boost line and the third voltage boost line;

a first pair of inverters connected in series between the first input node and the first output node;

a second pair of inverters connected in series between the second input node and the second output node;

an NOR gate receiving input signals from the first input node and the second input node; and an additional NOR gate receiving input signals from the NOR gate and the third input node and outputting an output signal to the third output node.

16. A memory structure comprising:

a first voltage boost line;

a first wordline;

a second voltage boost line, wherein the first wordline is between and parallel to the first voltage boost line and the second voltage boost line;

a cell supply line;

a third voltage boost line, where the cell supply line is between and parallel to the second voltage boost line and the third voltage boost line;

a second wordline;

a fourth voltage boost line, wherein the second wordline is between and parallel to the third voltage boost line and the fourth voltage boost line; and a digital voltage boost circuit connected to the first voltage boost line, the first wordline, the second voltage boost line, the third voltage boost line, the second wordline, and the fourth voltage boost line.

17. The memory structure of claim 16, further comprising multiple rows of memory cells, wherein the multiple rows comprise:

a first row of memory cells, wherein each memory cell in the first row is connected to the first wordline and to the cell supply line; and a second row of memory cells adjacent to the first row, wherein each memory cell in the second row is connected to the second wordline and to the cell supply line, wherein the first voltage boost line, the second voltage boost line, the third voltage boost line, and the fourth boost line extend a length of the rows.

18. The memory structure of claim 17, wherein the memory cells comprise static random access memory cells.

19. The memory structure of claim 16, wherein the digital voltage boost circuit further comprises:

a first input node connected to the first wordline;

a second input node connected to the second wordline;

a third input node that receives a mode select signal indicating one of a read mode and a write mode;

a first output node connected to the first voltage boost line;

a second output node connected to the fourth voltage boost line;

a third output node connected to the second voltage boost line and the third voltage boost line;

a first pair of inverters connected in series between the first input node and the first output node;

a second pair of inverters connected in series between the second input node and the second output node;

an NOR gate receiving input signals from the first input node and the second input node; and an additional NOR gate receiving input signals from the NOR gate and the third input node and outputting an output signal to the third output node.

20. The memory structure of claim 19, wherein, when a first wordline voltage on the wordline switches to a positive supply voltage level and the mode select signal indicates the read mode, output signals at the first output node and the third output node are high and an output signal at the second output node is low so the first voltage boost line, the second voltage boost line and the third voltage boost line are charged creating coupling capacitances between the first wordline and both the first voltage boost line and the second voltage boost line to increase the first wordline voltage on the first wordline above the positive supply voltage level and creating coupling capacitances between the cell supply line and both the second voltage boost line and the third voltage boost line to increase a cell supply voltage on the cell supply line above the positive supply voltage level, and wherein, when the first wordline voltage on the wordline switches to the positive supply voltage level and the mode select signal indicates the write mode, an output signal at the first output node is high and output signals at the second output node and the third output node are low so the first voltage boost line is charged creating a coupling capacitance between the first wordline and the first voltage boost line to increase the first wordline voltage on the first wordline above the positive supply voltage level without increasing the cell supply voltage on the cell supply line, wherein, when a second wordline voltage on the second wordline switches to the positive supply voltage level and the mode select signal indicates the read mode, output signals on the second output node and the third output node are high and an output signal on the first output node is low so the fourth voltage boost line, the second voltage boost line, and the third voltage boost line are charged creating coupling capacitances between the second wordline and both the fourth voltage boost line and the third voltage boost line to increase the second wordline voltage on the second wordline above the positive supply voltage level and creating coupling capacitances between the cell supply line and both the second voltage boost line and the third voltage boost line to increase the cell supply voltage on the cell supply line above the positive supply voltage level, and wherein, when the second wordline voltage on the second wordline switches to the positive supply voltage level and the mode select signal indicates the write mode, an output signal on the second output node is high and output signals on the first output node and the third output node are low so the fourth voltage boost line is charged creating a coupling capacitance between the second wordline and the fourth voltage boost line to increase the second wordline voltage on the first wordline above the positive supply voltage level without increasing the cell supply voltage, and wherein, when a first wordline voltage on the first wordline and a second wordline voltage on the second wordline are below the positive supply voltage level, output signals on the first output node, the second output node and the third output node are low so the first voltage boost line, the second voltage boost line, the third voltage boost line and the fourth voltage boost line are not charged by the voltage boost circuit.

* * * * *